US011039559B2

(12) United States Patent
Nagaishi

(10) Patent No.: US 11,039,559 B2
(45) Date of Patent: Jun. 15, 2021

(54) INFORMATION PROCESSING APPARATUS, MOUNTING APPARATUS, INFORMATION PROCESSING METHOD, AND COMPONENT GRIPPER

(71) Applicant: FUJI CORPORATION, Chiryu (JP)

(72) Inventor: Takuya Nagaishi, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 288 days.

(21) Appl. No.: 16/065,216

(22) PCT Filed: Dec. 24, 2015

(86) PCT No.: PCT/JP2015/085961
§ 371 (c)(1),
(2) Date: Jun. 22, 2018

(87) PCT Pub. No.: WO2017/109881
PCT Pub. Date: Jun. 29, 2017

(65) Prior Publication Data
US 2018/0376633 A1    Dec. 27, 2018

(51) Int. Cl.
*H05K 13/04* (2006.01)
*H05K 13/00* (2006.01)
*H05K 13/08* (2006.01)

(52) U.S. Cl.
CPC ..... *H05K 13/0413* (2013.01); *H05K 13/0015* (2013.01); *H05K 13/0408* (2013.01);
(Continued)

(58) Field of Classification Search
CPC ........... H05K 13/0015; H05K 13/0404; H05K 13/0408; H05K 13/0409; H05K 13/0413;
(Continued)

(56) References Cited

U.S. PATENT DOCUMENTS 4,731,923 A    3/1988   Yagi et al.
4,770,599 A    9/1988   Hawkswell
(Continued)

FOREIGN PATENT DOCUMENTS

DE    37 08 119 A1    9/1987
EP    1 037 519 A2    9/2000
(Continued)

OTHER PUBLICATIONS

International Search Report dated Mar. 22, 2016 in PCT/JP2015/085961 filed Dec. 24, 2015.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A control device is configured as an information processing apparatus which is used for a mounting apparatus for mounting a component on a board. The control device acquires an image, including at least a reference portion in a state where a component is gripped by a component gripper having a positioning grip portion that grips the component in a positioned state, and having the reference portion that represents a reference position serving as a predetermined relative position to the position of the component gripped by the positioning grip portion, acquires a position of the reference portion based on the acquired image, and acquires a position of the component based on the relative position to the acquired position of the reference portion.

9 Claims, 7 Drawing Sheets

(52) U.S. Cl.
CPC ..... *H05K 13/0426* (2013.01); *H05K 13/0812* (2018.08); *H05K 13/0813* (2018.08); *Y10T 29/53183* (2015.01)

(58) Field of Classification Search
CPC .......... H05K 13/0421; H05K 13/0426; H05K 13/0812; H05K 13/0813; Y10T 29/49133; Y10T 29/49139; Y10T 29/53174; Y10T 29/53183; Y10T 29/53191
See application file for complete search history.

(56) References Cited

U.S. PATENT DOCUMENTS

| | | | |
|---|---|---|---|
| 7,076,094 B2 | 7/2006 | Chi et al. | |
| 2002/0031279 A1* | 3/2002 | Shimizu | H05K 13/0812 382/291 |
| 2016/0198601 A1 | 7/2016 | Maeda et al. | |

FOREIGN PATENT DOCUMENTS

| | | |
|---|---|---|
| JP | 60-90690 A | 5/1985 |
| JP | 61-501117 A | 5/1986 |
| JP | 5-41598 A | 2/1993 |
| JP | 7-170099 A | 7/1995 |
| JP | 2002-280799 A | 9/2002 |
| JP | 2014-154841 A | 8/2014 |
| WO | WO 2015/019456 A1 | 2/2015 |

\* cited by examiner

INFORMATION PROCESSING APPARATUS, MOUNTING APPARATUS, INFORMATION PROCESSING METHOD, AND COMPONENT GRIPPER

TECHNICAL FIELD

The present application relates to an information processing apparatus, a mounting apparatus, an information processing method, and a component gripper.

BACKGROUND ART

Conventionally, for example, a mounting apparatus is disclosed in which horizontal light is applied to a limited portion in the longitudinal direction of a lead provided at a connector component from a direction orthogonal to the longitudinal direction of the lead, thereby causing the distal end of the lead to emit light, and thus the position of the lead is detected (for example, refer to Patent Literature 1). In this apparatus, the position of the lead can be quickly detected.

CITATION LIST

Patent Literature

Patent Literature 1: JP-A-2002-280799

BRIEF SUMMARY

Technical Problem

However, in the mounting apparatus described in Patent Literature 1, although the position of the lead can be quickly detected, when the height of the lead, the shape of the distal end of the lead, or the like changes, the distal end of the lead cannot be reliably detected in some cases.

The present disclosure has been contrived bearing in mind such a problem, and an object of the disclosure is to provide an information processing apparatus, a mounting apparatus, an information processing method, and a component gripper capable of more reliably acquiring the position of a grasped component.

Solution to Problem

In order to achieve the above-mentioned main object, the disclosure adopts the following means.

An information processing apparatus according to the disclosure is an information processing apparatus used for a mounting apparatus, mounting a component on a board, which includes a component gripper having a positioning grip portion that grips the component in a positioned state, and having a reference portion that represents a reference position serving as a predetermined relative position to the position of the component gripped by the positioning grip portion. The information processing apparatus includes a processing unit which acquires an image including at least the reference portion in a state where the component is gripped by the component gripper, acquires a position of the reference portion based on the acquired image, and acquires a position of the component based on the relative position to the acquired position of the reference portion.

According to the apparatus, an image of the component gripped by the positioning grip portion is acquired, and the position of the component is acquired not by the component itself in the image but by the relative position between the reference portion and the positioning grip portion which positions and grips the component. Therefore, according to the apparatus, it is possible to acquire the position of the component without depending on an image-capturing state of the component, whereby the position of the gripped component can be acquired more reliably.

In the information processing apparatus according to the disclosure, the component may have a lead, and the processing unit may acquire the position of the lead as the position of the component. According to the apparatus, the position of the lead of the component can be obtained more reliably. Therefore, for example, the mounting apparatus using this apparatus can further improve an insertion rate of the lead component when the component is mounted by inserting the lead. In the information processing apparatus, the component may have a lead and a main body on which the lead is disposed. In the component gripper, the positioning grip portion may have a groove portion which accommodates and positions the lead therein, and the lead may be fitted in the groove portion so that the component is gripped. According to the apparatus, by using the groove portion, it is easy to position and grip the component.

Alternatively, in the information processing apparatus of the disclosure, the component may have a main body, and the component gripper may position and grip the component by a positioning grip portion that grips the main body from four directions. According to the apparatus, positioning can be performed by grasping the main body from four directions.

In the information processing apparatus according to the disclosure, the reference portion may be at least one of a distal end surface of the positioning grip portion and a mark provided on the component gripper. According to the apparatus, the position of the gripped component can be obtained more reliably by using the distal end surface of the positioning grip portion or the mark.

In the information processing apparatus according to the disclosure, the reference portion may have a color different from that of a background. According to the apparatus, the reference portion can be easily recognized. Here, the "background" refers to a region around the reference portion in the captured image.

The mounting apparatus according to the disclosure includes: a mounting head equipped with a component gripper having a positioning grip portion that grips a component in a positioned state, and having a reference portion that represents a reference position serving as a predetermined relative position to the position of the component gripped by the positioning grip portion, the information processing apparatus described in any one of the information processing apparatuses; and a control unit which causes the mounting head to mount the component on the board using the position of the component, gripped by the component gripper, acquired by the information processing apparatus.

The mounting apparatus can more reliably acquire the position of the gripped component. Further, since this mounting apparatus includes any of the above-mentioned information processing apparatuses, it is possible to obtain an effect corresponding thereto. In addition, according to the mounting apparatus, the components can be more reliably mounted on the board.

An information processing method according to the disclosure is an information processing method used for a mounting apparatus for mounting a component on a board. The information processing method includes the steps of: (a) acquiring an image including at least a reference portion in a state where the component is gripped by a component gripper, including a positioning grip portion that grips the component in a positioned state and the reference portion that represents a reference position serving as a predetermined relative position to the position of the component gripped by the positioning grip portion; (b) acquiring a position of the reference portion based on the acquired image; and (c) acquiring a position of the component based on the relative position to the acquired position of the reference portion.

According to the method, similarly to the above-described information processing apparatus, the position of the gripped component can be acquired more reliably. In this information processing method, various modes of the above-described information processing apparatus may be adopted, and steps for realizing the individual functions of the above-described information processing apparatus may be added.

The component gripper according to the disclosure includes a positioning grip portion that grips a component in a positioned state, and a reference portion that represents a reference position serving as a predetermined relative position to the position of the component gripped by the positioning grip portion. The component gripper is used for the above-described information processing apparatus, whereby the position of the gripped component can be obtained more reliably. In this component gripper, various modes of the component gripper of the information processing apparatus described above may be adopted.

DESCRIPTION OF EMBODIMENTS

Figure 1:
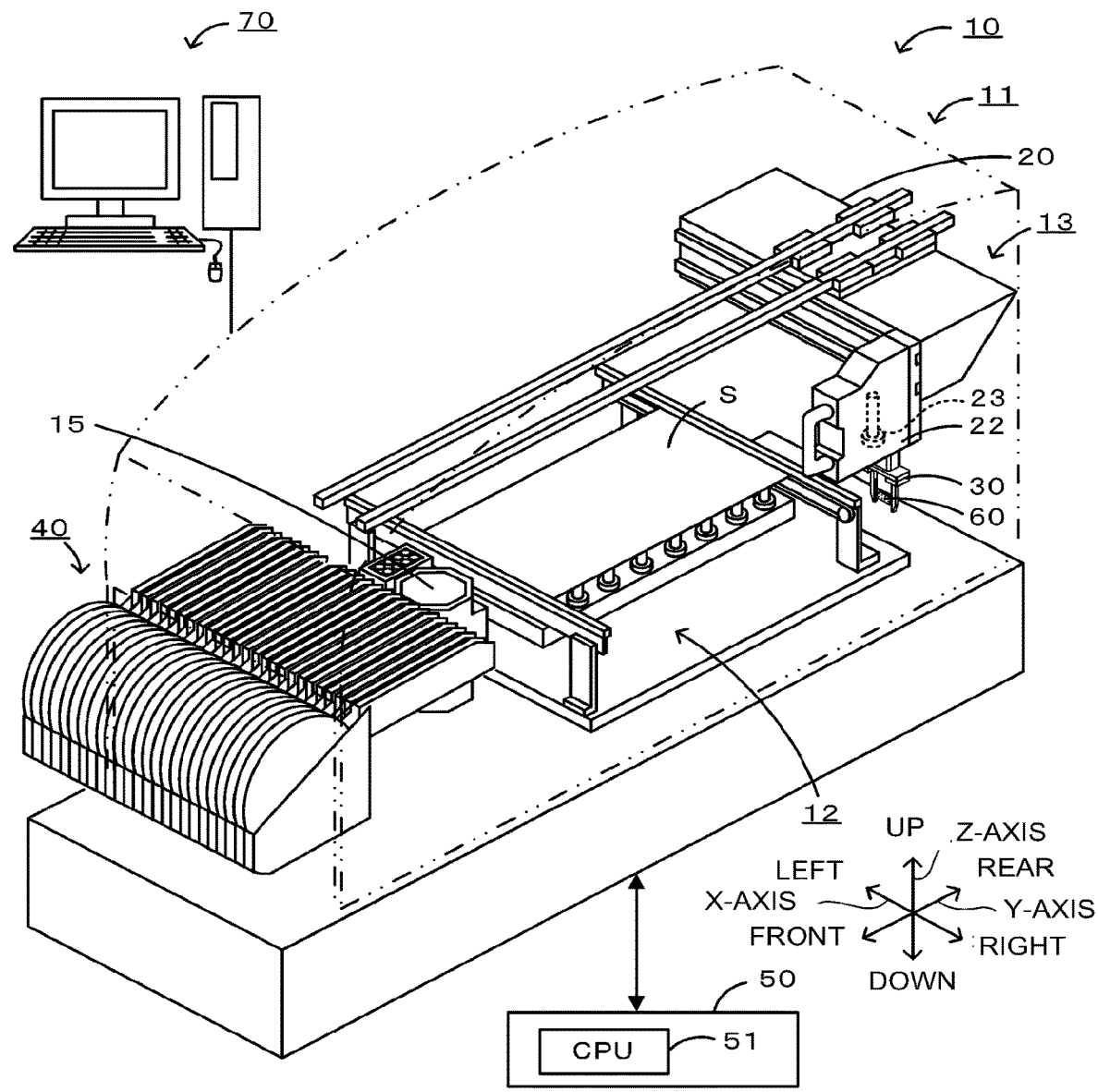
FIG. 1 is a schematic explanatory view illustrating an example of a mounting system 10.
Figure 2:
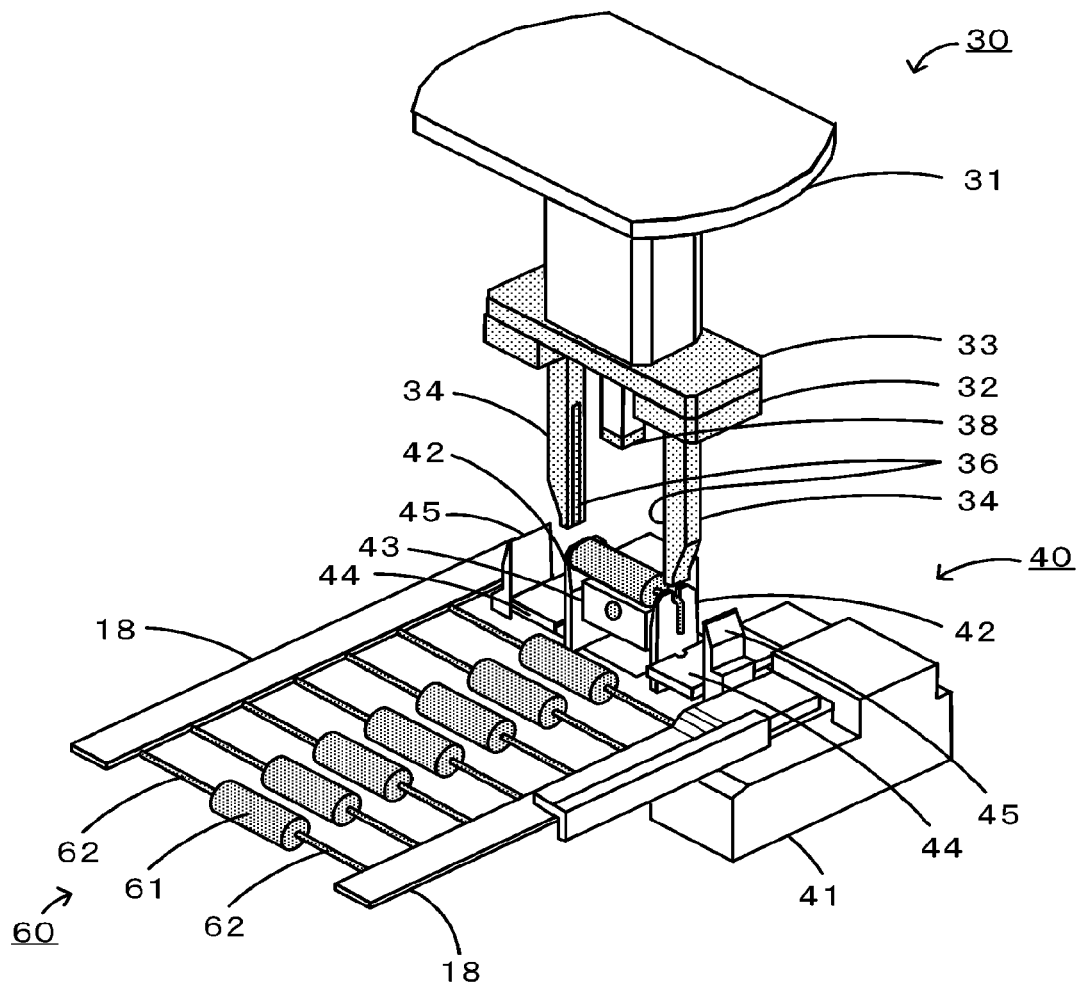
FIG. 2 is an explanatory view of a component gripper 30 and a component supply unit 40.
Figure 3:
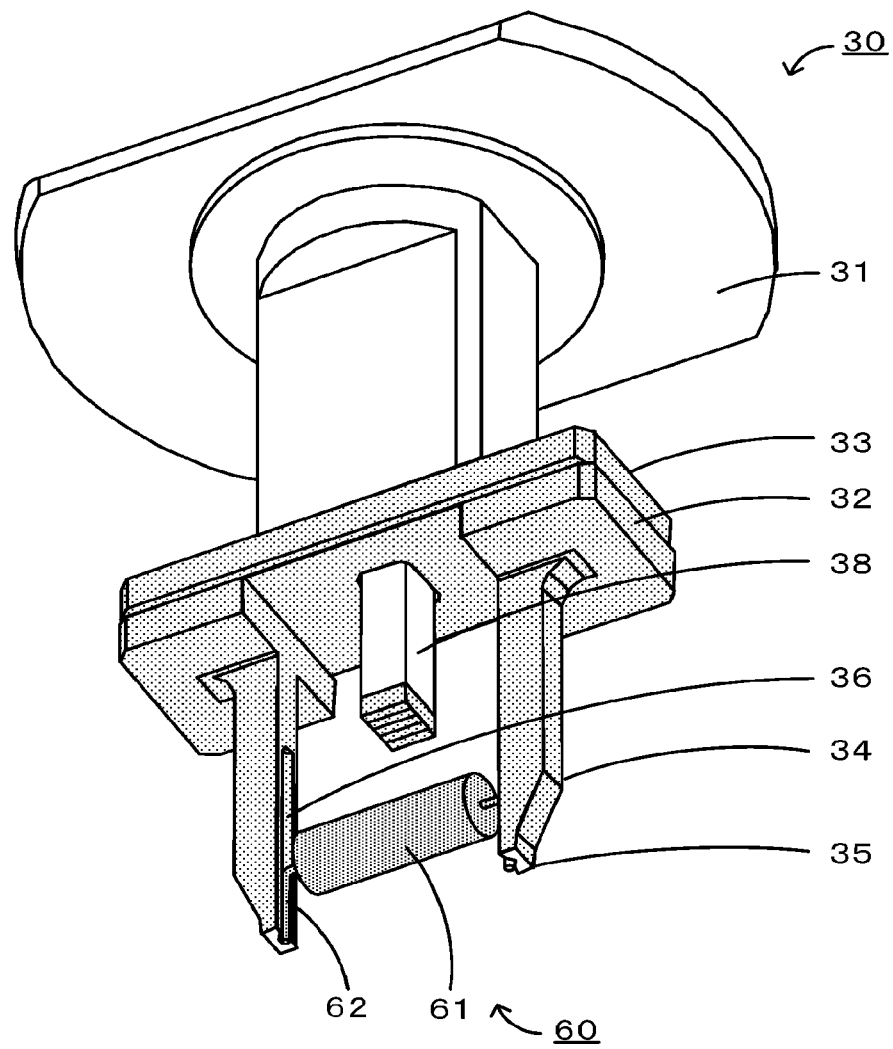
FIG. 3 is a perspective view of the component gripper 30.

A preferred embodiment of the disclosure is described below with reference to drawings. FIG. 1 is a schematic explanatory view showing an example of a mounting system 10. FIG. 2 is an explanatory view of a component gripper 30 and a component supply unit 40. FIG. 3 is a perspective view of the component gripper 30. The mounting system 10 is a system that executes a mounting processing related to a processing of mounting a component 60 on a board S. The mounting system 10 includes a mounting apparatus 11 and a management computer 70. In FIG. 1, only one mounting apparatus 11 is shown for convenience of explanation. In the embodiment, the left-right direction (X-axis), the front-rear direction (Y-axis), and the up-down direction (Z-axis) are as shown in FIG. 1.

As shown in FIGS. 1 to 3, the mounting apparatus 11 includes a board conveyance unit 12, a mounting unit 13, a part camera 15, a component supply unit 40, and a control device 50 (refer to FIG. 1). The board conveyance unit 12 is a unit for carrying in, conveying, fixing at a mounting position, and carrying out the board S. The board conveyance unit 12 has a pair of conveyor belts which are provided with an interval therebetween in the front-rear direction in FIG. 1 and are stretched in the left-right direction. The board S is transported by the conveyor belts.

The mounting unit 13 picks up the component 60 from the component supply unit 40 and places the component on the board S fixed to the board conveyance unit 12. The mounting unit 13 includes a head moving section 20, a mounting head 22, and a component gripper 30. The head moving section 20 includes a slider that is guided by guide rails and moves in the XY-directions, and a motor that drives the slider. The mounting head 22 is detachably attached to the slider and allowed to move in the XY-directions by the head moving section 20. The component gripper 30 is detachably attached to the lower face of the mounting head 22. The mounting head 22 incorporates a Z-axis motor 23, and causes the Z-axis motor 23 to adjust the height of the component gripper 30 along the Z-axis.

The part camera 15 captures an image of the component 60 picked-up by the mounting head 22, and is disposed in front of the board conveyance unit 12. The part camera 15 transmits the captured image to the control device 50. The captured image is used to determine an abnormality in the shape of the component, a positional deviation of the picked-up component, and the like.

The component gripper 30 is configured as, for example, a mechanical chuck that grips and picks up the component 60. As shown in FIGS. 2 and 3, the component 60 includes a cylindrical main body section 61 and leads 62 disposed at both ends of the cylinder. In the mounting apparatus 11, the lead 62 bent downward is inserted into a hole provided in the board S and then fixed by solder. Here, the component supply unit 40 for supplying the component 60 and the component gripper 30 for picking-up the component 60 will be mainly described as an example. As shown in FIGS. 2 and 3, the component gripper 30 includes a mounting base section 31, fixed base sections 32, positioning grip portions 34, reference portions 35 (refer to FIG. 3), groove portions 36, and a depression portion 38. The mounting base section 31 is mounted on the lower face of the mounting head 22, and a connection plate 33 is disposed below the mounting base section. The positioning grip portion 34 is disposed on the lower face side of the fixed base section 32. The fixed base section 32 is fixed to the lower face of the connection plate 33 with screws so as not to move. The fixed base sections 32 each are slidably fixable in the longitudinal direction of the connection plate 33 so as to change the interval between the positioning grip portions 34.

The positioning grip portions 34 are a pair of claw-shaped members for gripping the component 60 in a positioned state. The positioning grip portion 34 has a groove portion 36 for accommodating and positioning the lead 62. The groove portions 36 are V-shaped grooves formed, in the up-down direction along the longitudinal direction of the positioning grip portion 34, on the opposing surfaces of the pair of positioning grip portions 34. The lead 62 is brought into contact with the wall surface of the groove portion 36 by a spring force to be expanded, and the distal end of the lead is always positioned at a predetermined position (refer to FIG. 7 as will be described later). The reference portion 35 represents a reference position that is a predetermined relative position to the position of the component 60, and is a distal end surface of the positioning grip portion 34. The reference portion 35 has, for example, a color different from that of the background of an image captured by the part camera 15. Here, the background is, for example, a region around the reference portion 35 in an image captured by the part camera 15, such as main bodies of the fixed base section 32, the connection plate 33, and the positioning grip portion 34. In the component gripper 30, the background is colored in low luminance (e.g., gray or black) and the reference portion 35 is colored in high luminance (e.g., white or yellow). The reference portion 35 may have a contrast with the background for easy recognition, and hence the background may be colored in high luminance and the reference portion 35 may be colored in low luminance. The component gripper 30 positions the component 60 by fitting the lead 62 into the groove portion 36 of the positioning grip portion 34, and grips the component 60 so as not to fall by the spring force of the lead 62.

The component supply unit 40 includes multiple reels, and is detachably attached to the front side of the mounting apparatus 11. A tape is wound around each reel, and multiple components are held on the surface of the tape along the longitudinal direction of the tape. As shown in FIG. 2, the distal ends of the linear leads 62, 62 of the component 60 are fixed to the tapes 18, 18. The tape 18 is unwound backward from the reel, and is fed out by a transfer portion 41 to a pick-up position where the component 60 is collected by the component gripper 30 in a state where the component is exposed.

As shown in FIG. 2, the component supply unit 40 for supplying the component 60 includes the transfer portion 41, support plates 42, a push-up portion 43, bending plates 44, and separation portions 45. The transfer portion 41 is a mechanism for feeding the tape 18 with a gear and a sprocket that are not shown. The support plates 42 are plate-like members that support the leads 62 on both sides of the main body section 61 and lift the component 60 upward. The support plate 42 has a cutout at the center of the upper portion in which the lead 62 is fitted. The push-up portion 43 is disposed between the support plates 42, 42, and is a member that pushes up the main body section 61 from below. The bending plate 44 is fixed to a housing of the component supply unit 40, and has a cutout, on the side facing the support plate 42, through which the lead 62 can pass. When the component 60 is pushed up from below with being supported by the support plate 42 and the push-up portion 43, the lead 62 passes through the cutout of the bending plate 44 and is bent downward by the bending plate 44 with the support plate 42 as a fulcrum. The separation portion 45 is a member for cutting off the distal end side of the lead 62 fixed to the tape 18. The support plates 42, the push-up portion 43, and the separation portions 45 are disposed on a not-shown seat, and move in the up-down direction together with the seat.

As shown in FIG. 1, the control device 50 is constituted as a microprocessor mainly configured of a CPU 51. The control device 50 outputs control signals to the board conveyance unit 12, the mounting unit 13, the part camera 15, and the component supply unit 40, and inputs signals from the mounting unit 13, the part camera 15, and the component supply unit 40. The control device 50 stores information (e.g., relative coordinates, distances, etc.) relating to the relative positional relationship between the reference portion 35 and the component 60 (the distal end of the lead 62). The control device 50 performs a processing of acquiring an image including at least the reference portion 35 in a state in which the component 60 is gripped, acquiring the position of the reference portion 35 based on the acquired image, and acquiring the position of the component 60 based on the relative position to the acquired position of the reference portion 35.

The management computer 70 is a computer that manages information of each device of the mounting system 10. The management computer 70 includes input devices such as a keyboard and a mouse for an operator to input various instructions, and a display for displaying various information.

Figure 4:
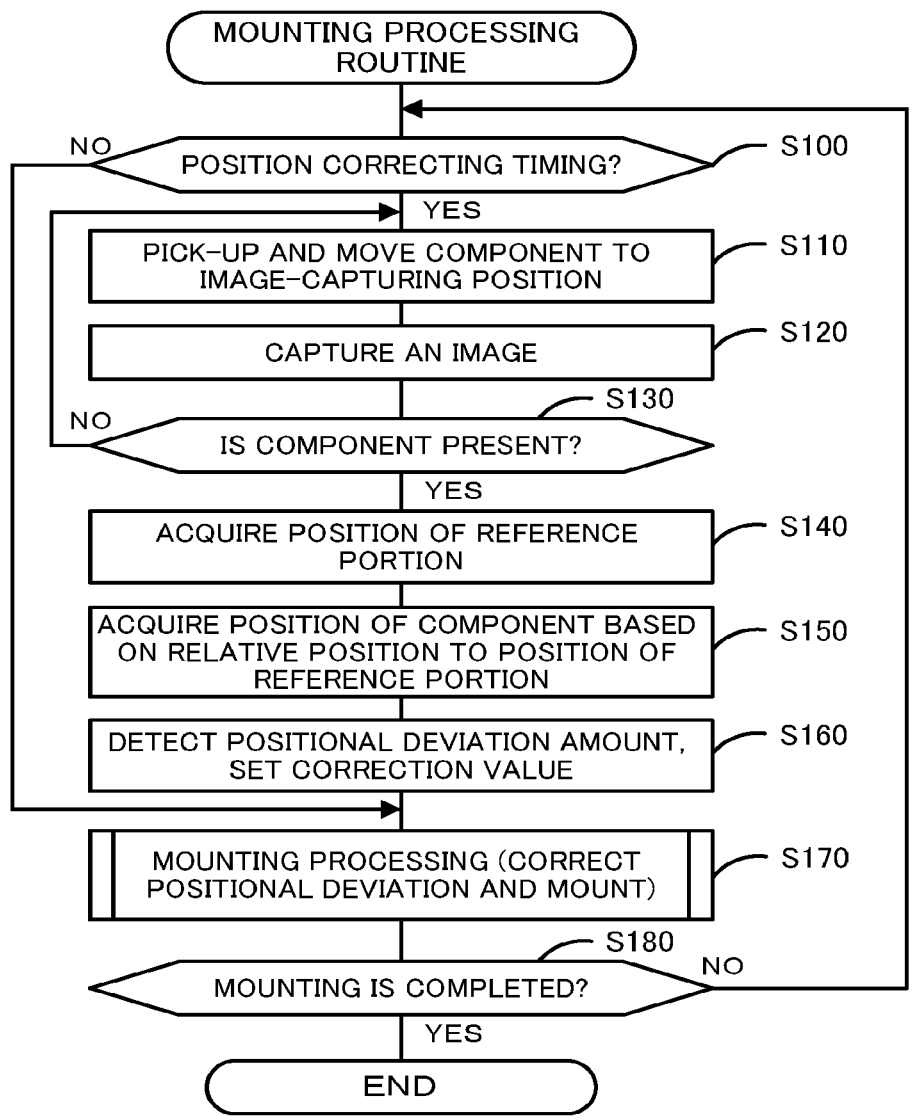
FIG. 4 is a flowchart showing an example of a mounting processing routine.

Next, an operation of the mounting system 10 according to the embodiment configured as described above, specifically, a mounting processing of the mounting apparatus 11 will be described. The case of mounting the component 60 using the component gripper 30 will be described as a main specific example. FIG. 4 is a flowchart showing an example of the mounting processing routine executed by the CPU 51 of the control device 50. This routine is stored in a memory section of the control device 50, and is executed in response to a start instruction from the operator. When this routine is started, the CPU 51 of the control device 50 first determines whether or not it is timing to correct the position of the mounting head 22 (step S100). The timing may be, for example, at the time of starting the apparatus, or at the time of restarting after replacement of the tape 18 or after stoppage by an error. When the timing is the positional correction timing, the CPU 51 causes the component gripper 30 to pick up the component 60 and move the picked-up component 60 to the reference imaging position of the part camera 15 (step 3110).

Figure 5:
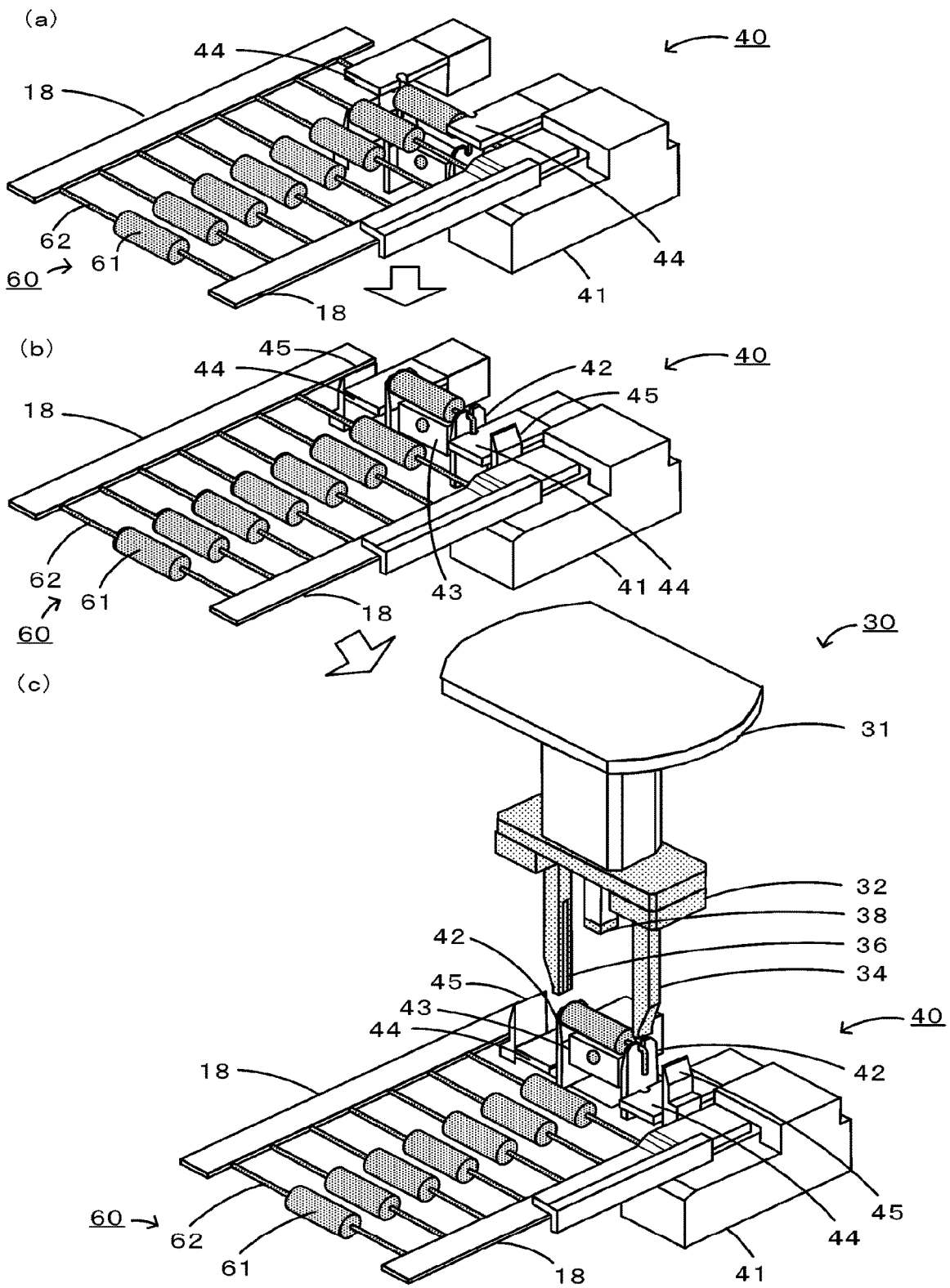
FIG. 5 is an explanatory view of a pick-up processing of a component 60.

The operation of the component gripper 30 to pick up the component 60 from the component supply unit 40 will be described. FIG. 5 is an explanatory view of the picking-up processing of the component 60. In the picking-up processing, the component supply unit 40 causes the transfer portion 41 to move the component 60 at the most distal end held by the tapes 18 to the upper side of the support plates 42 and the push-up portion 43 (FIG. 5A). The initial positions of the support plates 42, the push-up portion 43, and the separation portions 45 are below the tapes 18. Next, the component supply unit 40 moves the support plates 42, the push-up portion 43, and the separation portions 45 upward. Then, the component 60 is separated from the tape 18, and the lead 62 pressed by the bending plate 44 is bent downward with the support plate 42 as a fulcrum while the lead 62 passes through the cutout portion of the bending plate 44 (FIG. 5B). Subsequently, the CPU 51 causes the component gripper 30 to move above the component 60 in which the leads 62 are bent, then causes the component gripper 30 to move downward (FIG. 5C) so as to guide the leads 62 to the groove portions 36 of the positioning grip portions 34, and causes the positioning grip portions 34 to grip the component 60. The component gripper 30 may be arranged at the pick-up position of the component 60 before the upward moving of the support plates 42, and the component supply unit 40 may cause the positioning grip portions 34 to grip the component 60 along with the bending of the leads 62.

Figure 6:
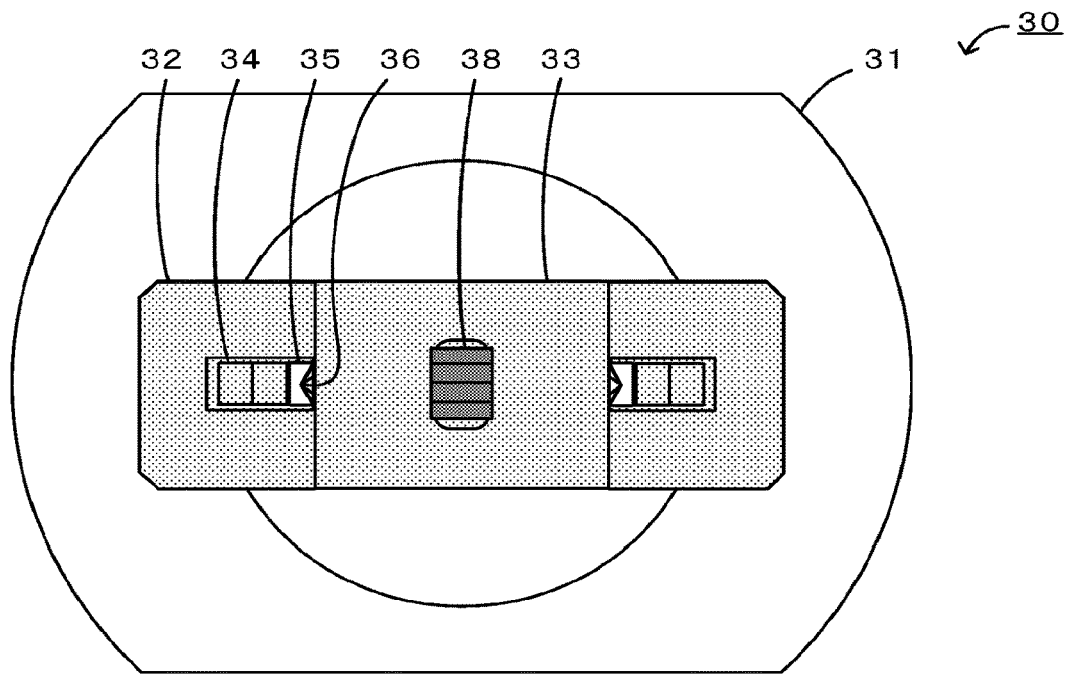
FIG. 6 is an explanatory view of the component gripper 30 that does not grip the component 60.
Figure 7:
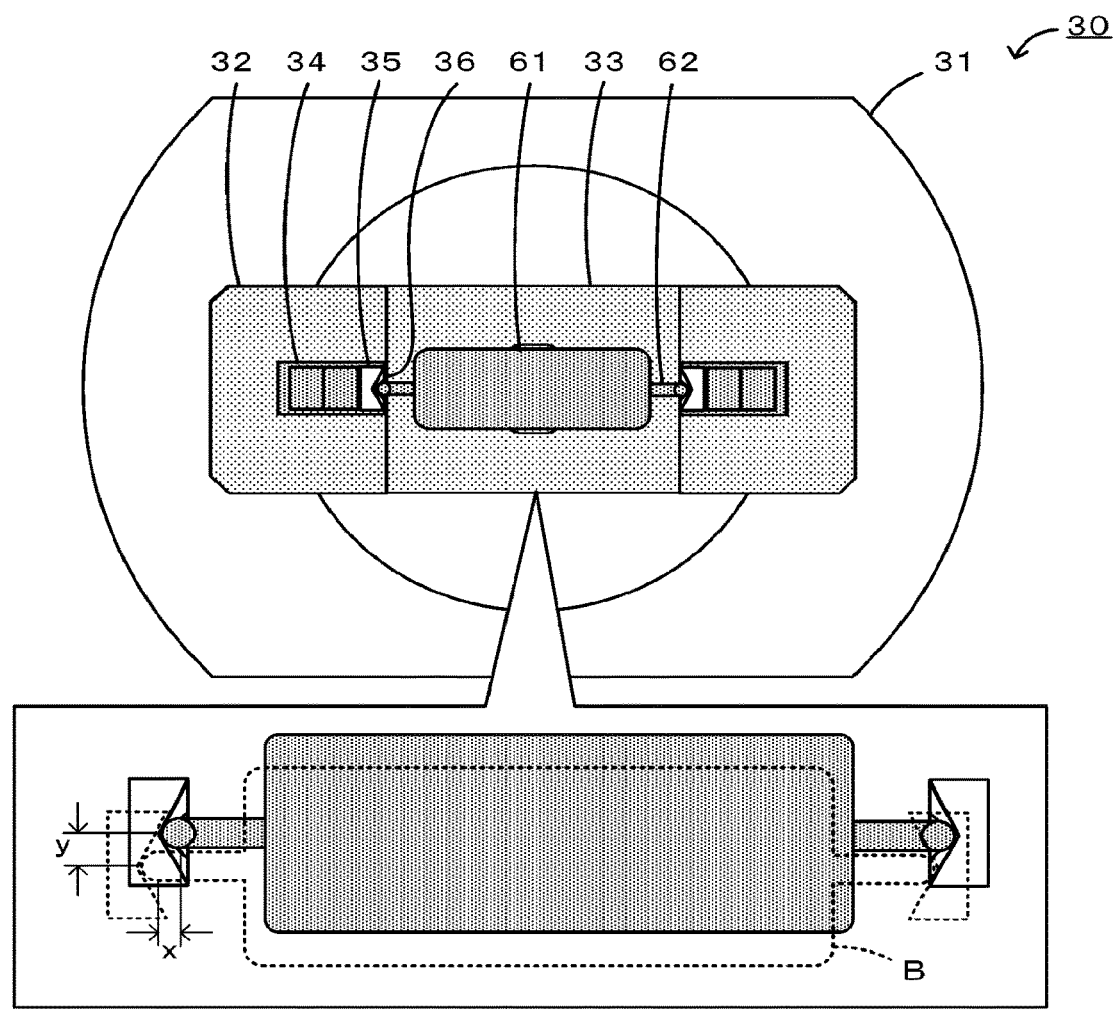
FIG. 7 is an explanatory view of the component gripper 30 gripping the component 60.

When the component gripper 30 moves to the reference imaging position above the part camera 15, the CPU 51 causes the part camera 15 to capture an image including at least the reference portion 35 (step S120). Next, the CPU 51 determines whether or not the component 60 is present in the captured image (step S130). That is, the CPU 51 determines whether or not the component gripper 30 has been able to pick up the component 60. This determination can be made, for example, based on whether the pixel value of the region where the component 60 is supposed to exist is the pixel value of the component 60 or the pixel value of the connection plate 33. FIG. 6 is an explanatory view of the component gripper 30 that does not grip the component 60. FIG. 7 is an explanatory view of the component gripper 30 gripping the component 60. The captured image is, for example, the image shown in FIG. 6 if the component 60 is not present, and the image shown in FIG. 7 if the component 60 is present. When the component 60 is not present in the captured image, the CPU 51 executes the processing in and after step S110. In this case, the CPU 51 may display an error and stop the mounting processing. On the other hand, when the component 60 is present in the captured image in step S130, the position of the reference portion 35 is acquired (step S140). In this processing, for example, a binarization processing may be performed on the region where the reference portion 35 is supposed to exist, edge detection may be performed based on a displacement of the pixel value of each pixel, the region of the pixel value corresponding to the reference portion 35 may be extracted, and the position (coordinate) of the reference portion 35 may be acquired.

Subsequently, the CPU 51 acquires the position of the component 60 based on the relative position to the acquired position of the reference portion 35 (step S150). It is assumed that the CPU 51 acquires the position (distal end surface) of the lead 62 as the position of the component 60. The component 60 is gripped by the positioning grip portions 34 with the leads 62 fitted in the groove portions 36 of the positioning grip portions 34. The reference portion 35 is the distal end surface of the positioning grip portion 34. Due to these relationships, the relative positional relationship between the reference portion 35 and the component 60 (the lead 62) is determined in advance, so that the position of the distal end surface of the lead 62 can be obtained from the position of the reference portion 35. Next, the CPU 51 detects a positional deviation amount based on the relative position between the acquired position of the lead 62 and the normal reference position B (refer to FIG. 7), and sets a correction value for correcting the position of the mounting head 22 for correcting the positional deviation (step S160). The CPU 51 sets, for example, correction values for correcting a positional deviation amount x in the X-axis direction and a positional deviation amount y in the Y-axis direction in FIG. 7.

After step S160 or if the timing is determined not to be the positional correction timing in step S100, the CPU 51 performs the mounting processing of the component 60 using the set correction values for the positional deviation (step S170). In the mounting processing, the CPU 51 performs the following processing. First, when the component 60 is not gripped by the component gripper 30, the CPU 51 performs the processing of steps S110 to S130, and thus the component 60 is picked up from the component supply unit 40. Next, the CPU 51 causes the mounting head 22 to move to a position where the component 60 is mounted on the board S, and drives the Z-axis motor 23 to lower the component gripper 30 and further to lower the pressing portion 38, whereby the component 60 is inserted and disposed on the board S. Then, the CPU 51 determines whether or not the mounting of all the components 60 on the board S has been completed (step S180), and when it is determined that the mounting processing has not been completed yet, the CPU executes the processing in and after step S100. On the other hand, when the mounting processing is completed, this routine is finished as it is.

Here, the correspondence relationship between the constituent elements of the embodiment and the constituent elements of the disclosure will be clarified. The control device 50 of the embodiment corresponds to a processing unit and an information processing apparatus of the disclosure, the component gripper 30 corresponds to a component gripper, the positioning grip portion 34 corresponds to a positioning grip portion, and the reference portion 35 corresponds to a reference portion. In the embodiment, an example of the information processing method according to the disclosure is also clarified by explaining the operation of the mounting apparatus 11.

According to the mounting apparatus 11 of the embodiment described above, an image of the component 60 gripped by the positioning grip portions 34 is acquired, and the position of the component 60 is acquired not by the component 60 itself in the image but by the relative positional relationship between the reference portions 35 and the positioning grip portions 34 which position and grip the component 60. In general, when the insertability of the lead 62 into the board S is intended to be enhanced, it is conceivable to enhance the detection accuracy of the distal end of the lead 62. However, in the captured image, for example, there is a case where the distal end surface of the lead 62 is not flat or where the height position of the distal end surface is not constant, and so it is difficult to specify the distal end surface of the lead 62 from the captured image with high accuracy. In the mounting apparatus 11, by using the position of the reference portion 35, it is possible to acquire the position of the component 60 without depending on the image-capturing state of the component 60, so that the position of the gripped component 60 can be acquired more reliably.

Further, the mounting apparatus 11 can more reliably acquire the position of the lead 62 based on the position of the reference portion 35, and thus can further improve the insertion rate of the lead component when the component 60 is mounted by inserting the lead 62 into the board S. Further, in the mounting apparatus 11, the positioning grip portion 34 of the component gripper 30 has the groove portion 36 for accommodating and positioning the lead 62, and the lead 62 is fitted into the groove portion 36, whereby the component 60 is gripped. Thus, the component 60 is easily positioned and gripped by the groove portion 36. Furthermore, since the reference portion 35 is the distal end surface of the positioning grip portion 34, the position of the gripped component 60 can be obtained more reliably using the distal end surface of the positioning grip portion 34. Since the reference portion 35 has a color different from that of the connection plate 33 or the like serving as the background, the control device 50 can easily recognize the reference portion 35. Further, the mounting apparatus 11 can more reliably acquire the position of the gripped component 60, and thus can more reliably mount the component 60 on the board S.

It is to be understood that the disclosure is not limited to the above-described embodiment, and may be implemented in various modes as long as it falls within the technical scope of the disclosure.

Figure 8:
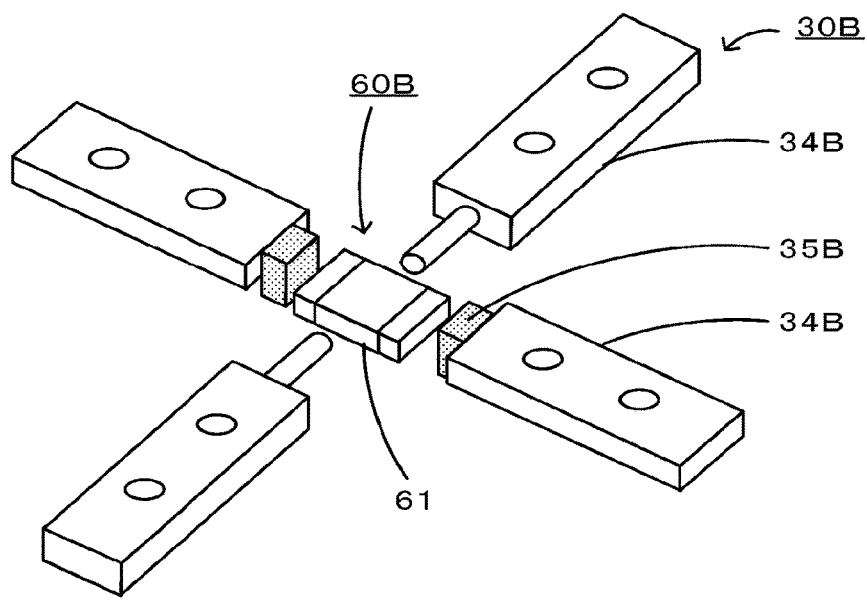
FIG. 8 is an explanatory view of another component gripper 30B.

For example, in the embodiment described above, the component gripper 30 has been described as gripping the component 60 including the main body section 61 and the leads 62, but component gripper is not particularly limited to this as long as the component can be gripped in a positioned state. For example, the positioning grip portion 34 may be configured to position and grip the component 60 with a structure other than the groove portion 36. Alternatively, the component may not have the lead 62 and the positioning grip portion 34 may not have the groove portion 36. In this case, as shown in FIG. 8, a component 60B may have the main body 61, and a component gripper 30B may position and grip the component 60B with positioning grip portions 34B that grip the main body 61 from four directions. FIG. 8 is an explanatory view of another component gripper 30B. The component gripper 30B has reference portions 35B at the distal ends of the positioning grip portions 34B. The component gripper 30B can position the main body by gripping it from four directions.

Figure 9:
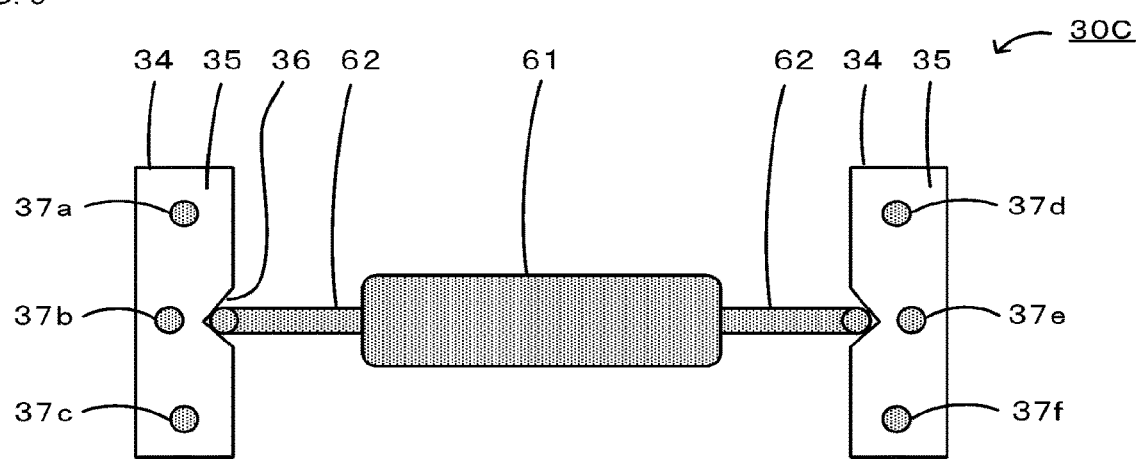
FIG. 9 is an explanatory view of a component gripper 30C having marks 37a to 37f.

In the embodiment described above, the reference portion 35 is the distal end surface of the positioning grip portion 34, but the reference portion 35 is not particularly limited to this as long as it is a portion capable of specifying a position by image recognition, and may be, for example, one or more side portions of the distal end surface of the positioning grip portion 34. Alternatively, in the component gripper 30, the reference portion 35 may be a mark provided at any position of the component gripper 30. FIG. 9 is an explanatory view of a component gripper 30C having marks 37a to 37f as the reference portions. The component gripper 30C has the circular marks 37a to 37f on the distal end surfaces of the positioning grip portions 34. It should be noted that the position and the number of the marks are not particularly limited as long as the marks each have a relative positional relationship with the distal end position of the lead 62 to enable gripping of the distal end position of the lead 62. For example, the positioning grip portions 34 may have one or more of the marks 37a to 37c and one or more of the marks 37d to 37f, respectively. This mounting apparatus can obtain the position of the gripped component more reliably by using the marks. It is preferable that the marks have shapes and colors that can be easily identified by the image processing, and examples thereof include circles, ellipses, rectangles, polygons, stars, and the like. The reference portion may be, for example, a combination of two or more of the mark, the distal end surface, and the side portion of the member.

In the embodiment described above, the control device 50 has been described as having the function of the information processing apparatus according to the disclosure, but the disclosure is not particularly limited thereto, and a processing unit may be provided separately from the control device 50 for controlling the mounting processing. Alternatively, the control unit of the management computer 70 may have the function of the information processing apparatus of the disclosure. In addition, multiple control devices may share the functions of the information processing apparatus of the disclosure.

Although not described in the above embodiment, for example, the control device 50 may obtain the interval between the reference portions 35, 35 from the obtained positions of the reference portions 35, 35, and determine whether or not the correct component gripper 30 is mounted on the mounting head 22 using the interval. By doing so, it is possible to prevent erroneous mounting due to the use of an erroneous component gripper, in advance.

In the above-described embodiment, the invention has been described as the mounting apparatus 11, but the invention may be the control device 50, the invention may be the component gripper 30, the invention may be the information processing method or the control method of the mounting apparatus 11, or the invention may be a program for executing the above-described processing by a computer.

INDUSTRIAL APPLICABILITY

The disclosure can be applied to a mounting apparatus for disposing a component on a board.

REFERENCE SIGNS LIST 10 mounting system, 11 mounting apparatus, 12 board conveyance unit, 13 mounting unit, 15 part camera, 18 tape, 20 head moving section, 22 mounting head, 23 Z-axis motor, 30, 30B, 30C component gripper, 31 mounting base, 32 fixed base section, 33 connection plate, 34, 34B positioning grip portion, 35, 35B reference portion, 36 groove portion, 37a to 37f mark, 38 pressing portion, 40 component supply unit, 41 transfer portion, 42 support plate, 43 push-up portion, 44 bending plate, 45 separation portion, 50 control device, 51 CPU, 60, 60B component, 61 main body section, 62 lead, 70 management computer, B reference position, S board.

The invention claimed is:

1. A mounting apparatus to mount a component on a board, comprising:
a component gripper including a pair of opposing positioning grip portions that close around the component to grip the component in a positioned state; and a reference portion on at least one of the opposing, positioning grip portions that represents a reference position serving as a predetermined relative position to a position of the component gripped by the opposing positioning grip portions; and,
a control unit including a processor, the control unit configured to acquire via a camera an image including at least the reference portion in a state where the component k gripped by the component gripper, determine a position of the reference portion based on the acquired image, and determine a position of the component based on the relative position of the component to the position of the reference portion.

2. The mounting apparatus according to claim 1, wherein the component has a lead, and the control unit determines a position of the lead as the position of the component.

3. The mounting apparatus according to claim 2,
wherein the component has a main body on which the lead is disposed, and
wherein, in the component gripper, the positioning grip portion has a groove portion which accommodates and positions the lead, and the lead is fitted in the groove portion so that the component is gripped.

4. The mounting apparatus according to claim 1, wherein the component has a main body, and the component gripper positions and grips the component by a positioning grip portion that grips the main body from four directions.

5. The mounting apparatus according to claim 1, wherein the reference portion is at least one of a distal end surface of the positioning grip portion and a mark provided on the component gripper.

6. The mounting apparatus according to claim 1, wherein the reference portion has a color different from that of a background.

7. The mounting apparatus according to claim 1,
wherein the control unit causes the mounting head to mount the component on the board using a position of the component gripped by the component gripper, determined by the control unit.

8. The mounting apparatus according to claim 1, wherein the reference portion has a color or luminance different from the lead.

9. An information processing method used for a mounting apparatus which mounts a component on a board, the information processing method comprising the steps of:
(a) acquiring via a camera an image including at least a reference portion in a state where the component is gripped by a component gripper, including a pair of opposing positioning grip portions that close around the component to grip the component in a positioned state and the reference portion being on at least one of the opposing positioning grip portions and representing a reference position serving as a predetermined relative position to the position of the component gripped by the opposing positioning grip portions;

(b) determining a position of the reference portion based on the acquired image; and (c) determining a position of the component based on the relative position of the component to the acquired position of the reference portion.

\* \* \* \* \*